US012652811B2

(12) United States Patent
Lin et al.

(10) Patent No.: US 12,652,811 B2
(45) **Date of Patent: *Jun. 9, 2026**

(54) HIGH DENSITY CAPACITOR IMPLEMENTED USING FinFET

(71) Applicant: Taiwan Semiconductor Manufacturing Co., Ltd., Hsin-Chu (TW)

(72) Inventors: Jiefeng Lin, Hsinchu (TW); Hsiao-Lan Yang, Taipei City (TW); Chih-Yung Lin, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 131 days.

This patent is subject to a terminal disclaimer.

(21) Appl. No.: 18/355,072

(22) Filed: Jul. 19, 2023

(65) Prior Publication Data

US 2023/0369387 A1     Nov. 16, 2023

Related U.S. Application Data

(60) Continuation of application No. 17/034,459, filed on Sep. 28, 2020, now Pat. No. 11,728,373, which is a
(Continued)

(51) Int. Cl.
*H10D 1/68*      (2025.01)
*H10D 62/10*     (2025.01)
(Continued)

(52) U.S. Cl.
CPC ........... *H10D 1/692* (2025.01); *H10D 62/115* (2025.01); *H10D 84/0135* (2025.01);
(Continued)

(58) Field of Classification Search
CPC ......... H01L 21/76224; H01L 21/76897; H01L 21/823431; H01L 21/823475;
(Continued)

(56) References Cited

U.S. PATENT DOCUMENTS

| | | |
|---|---|---|
| 7,425,740 B2 | 9/2008 | Liu et al. |
| 7,667,271 B2 | 2/2010 | Yu et al. |

(Continued)

FOREIGN PATENT DOCUMENTS

| | | |
|---|---|---|
| CN | 105428414 A | 3/2016 |

*Primary Examiner* — Xia L Cross
(74) *Attorney, Agent, or Firm* — HAYNES AND BOONE, LLP

(57) ABSTRACT

A first and a second gate structure each extend in a first direction. A first and a second conductive contact extend in the first direction and are separated from the first and second gate structures in a second direction. A first isolation structure extends in the second direction and separates the first gate structure from the second gate structure. A second isolation structure extends in the second direction and separates the first conductive contact from the second conductive contact. The first gate structure is electrically coupled to a first electrical node. The second gate structure is electrically coupled to a second electrical node different from the first electrical node. The first conductive contact is electrically coupled to the second electrical node. The second conductive contact is electrically coupled to the first electrical node.

20 Claims, 11 Drawing Sheets

Related U.S. Application Data division of application No. 16/021,662, filed on Jun. 28, 2018, now Pat. No. 10,790,352.

(51) Int. Cl.

| | |
|---|---|
| *H10D 84/01* | (2025.01) |
| *H10D 84/03* | (2025.01) |
| *H10D 84/80* | (2025.01) |
| *H10W 10/00* | (2026.01) |
| *H10W 10/17* | (2026.01) |
| *H10W 20/00* | (2026.01) |
| *H10W 20/42* | (2026.01) |
| *H10W 20/43* | (2026.01) |
| *H10D 30/62* | (2025.01) |
| *H10P 95/00* | (2026.01) |

(52) U.S. Cl.
CPC ..... *H10D 84/0149* (2025.01); *H10D 84/0151* (2025.01); *H10D 84/0158* (2025.01); *H10D 84/038* (2025.01); *H10D 84/811* (2025.01); *H10W 10/014* (2026.01); *H10W 10/17* (2026.01); *H10W 20/069* (2026.01); *H10W 20/42* (2026.01); *H10W 20/43* (2026.01); *H10D 30/62* (2025.01); *H10P 95/062* (2026.01)

(58) Field of Classification Search
CPC ......... H01L 21/823481; H01L 23/5226; H01L 23/528; H01L 29/0649; H01L 29/785
USPC ........................................................ 257/300
See application file for complete search history.

(56) References Cited

U.S. PATENT DOCUMENTS

| | | | |
|---|---|---|---|
| 7,910,453 | B2 | 3/2011 | Xu et al. |
| 8,048,723 | B2 | 11/2011 | Chang et al. |
| 8,053,299 | B2 | 11/2011 | Xu |
| 8,183,627 | B2 | 5/2012 | Currie |
| 8,362,575 | B2 | 1/2013 | Kwok et al. |
| 8,367,498 | B2 | 2/2013 | Chang et al. |
| 8,377,779 | B1 | 2/2013 | Wang |
| 8,399,931 | B2 | 3/2013 | Liaw et al. |
| 8,415,718 | B2 | 4/2013 | Xu |
| 8,440,517 | B2 | 5/2013 | Lin et al. |
| 8,487,378 | B2 | 7/2013 | Goto et al. |
| 8,497,177 | B1 | 7/2013 | Chang et al. |
| 8,497,528 | B2 | 7/2013 | Lee et al. |
| 8,609,518 | B2 | 12/2013 | Wann et al. |
| 8,610,240 | B2 | 12/2013 | Lee et al. |
| 8,618,556 | B2 | 12/2013 | Wu et al. |
| 8,633,516 | B1 | 1/2014 | Wu et al. |
| 8,652,894 | B2 | 2/2014 | Lin et al. |
| 8,680,576 | B2 | 3/2014 | Ching et al. |
| 8,686,516 | B2 | 4/2014 | Chen et al. |
| 8,703,565 | B2 | 4/2014 | Chang et al. |
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,729,634 | B2 | 5/2014 | Shen et al. |
| 8,735,993 | B2 | 5/2014 | Lo et al. |
| 8,736,056 | B2 | 5/2014 | Lee et al. |
| 8,742,509 | B2 | 6/2014 | Lee et al. |
| 8,772,109 | B2 | 7/2014 | Colinge |
| 8,776,734 | B1 | 7/2014 | Roy et al. |
| 8,785,285 | B2 | 7/2014 | Tsai et al. |
| 8,796,666 | B1 | 8/2014 | Huang et al. |
| 8,796,759 | B2 | 8/2014 | Perng et al. |
| 8,809,139 | B2 | 8/2014 | Huang et al. |
| 8,815,712 | B2 | 8/2014 | Wan et al. |
| 8,816,444 | B2 | 8/2014 | Wann et al. |
| 8,823,065 | B2 | 9/2014 | Wang et al. |
| 8,826,213 | B1 | 9/2014 | Ho et al. |
| 8,828,823 | B2 | 9/2014 | Liu et al. |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,860,148 | B2 | 10/2014 | Hu et al. |
| 8,887,106 | B2 | 11/2014 | Ho et al. |
| 9,105,490 | B2 | 8/2015 | Wang et al. |
| 2011/0023003 | A1 | 1/2011 | Su et al. |
| 2011/0068407 | A1 | 3/2011 | Yeh et al. |
| 2013/0011983 | A1 | 1/2013 | Tsai et al. |
| 2013/0256772 | A1 | 10/2013 | Fu |
| 2013/0285153 | A1 | 10/2013 | Lee et al. |
| 2014/0001574 | A1 | 1/2014 | Chen et al. |
| 2014/0110755 | A1 | 4/2014 | Colinge |
| 2014/0151812 | A1 | 6/2014 | Liaw |
| 2014/0183600 | A1 | 7/2014 | Huang et al. |
| 2014/0252412 | A1 | 9/2014 | Tsai et al. |
| 2014/0264590 | A1 | 9/2014 | Yu et al. |
| 2014/0264592 | A1 | 9/2014 | Oxland et al. |
| 2014/0282326 | A1 | 9/2014 | Chen et al. |
| 2015/0263003 | A1 | 9/2015 | Lee et al. |
| 2015/0303208 | A1* | 10/2015 | Kim ..................... H01L 23/528 257/300 |
| 2016/0056154 | A1 | 2/2016 | Watanabe |
| 2016/0111418 | A1 | 4/2016 | Wang |
| 2016/0181404 | A1 | 6/2016 | Wen et al. |
| 2016/0336183 | A1 | 11/2016 | Yuan et al. |
| 2018/0108720 | A1* | 4/2018 | Kim ..................... H10D 86/423 |
| 2018/0138168 | A1 | 5/2018 | Wang |
| 2020/0006467 | A1 | 1/2020 | Lin et al. |

* cited by examiner

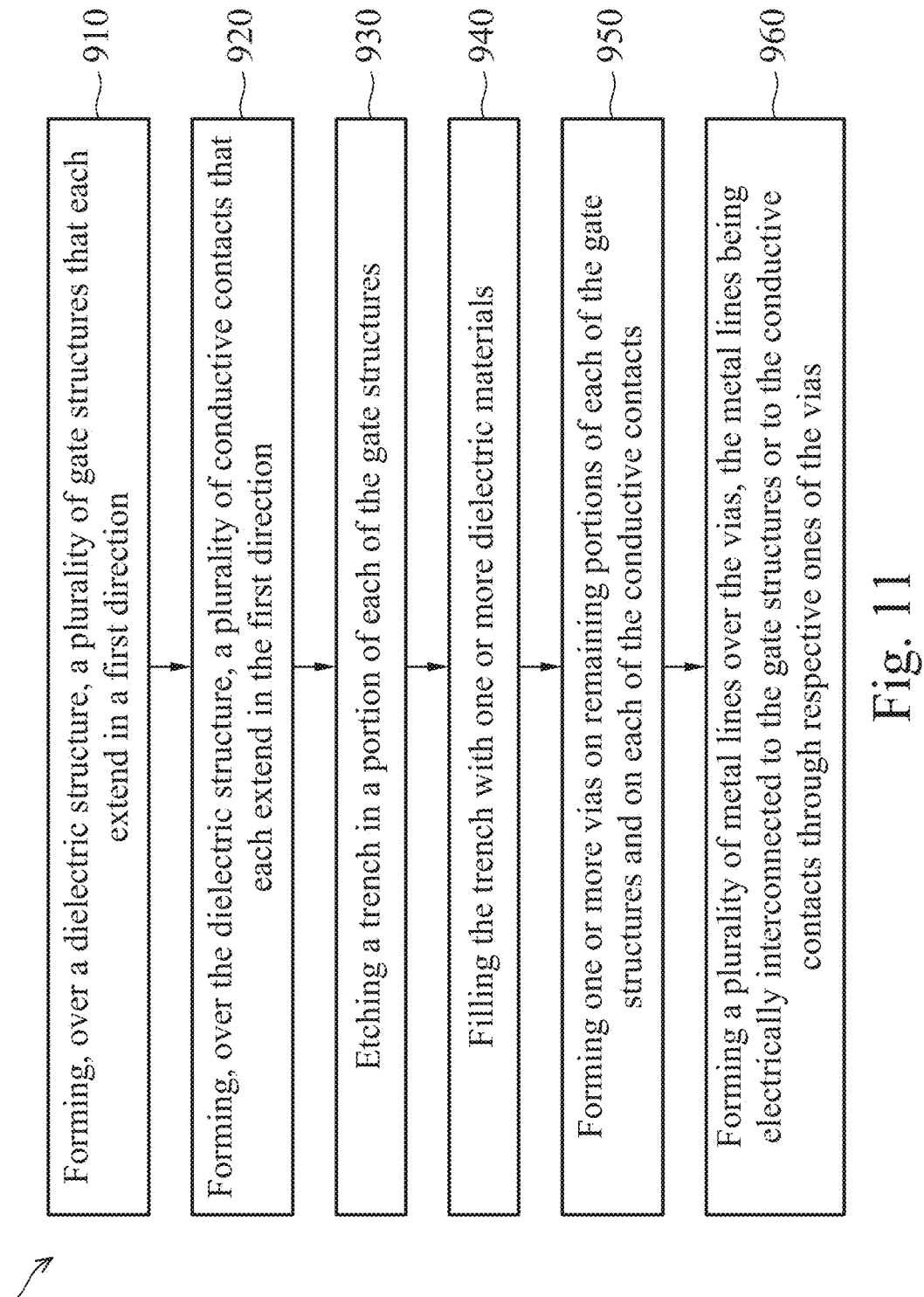

Forming, over a dielectric structure, a plurality of gate structures that each extend in a first direction — 910

Forming, over the dielectric structure, a plurality of conductive contacts that each extend in the first direction — 920

Etching a trench in a portion of each of the gate structures — 930

Filling the trench with one or more dielectric materials — 940

Forming one or more vias on remaining portions of each of the gate structures and on each of the conductive contacts — 950

Forming a plurality of metal lines over the vias, the metal lines being electrically interconnected to the gate structures or to the conductive contacts through respective ones of the vias — 960

HIGH DENSITY CAPACITOR IMPLEMENTED USING FinFET

The present application is a Continuation of U.S. patent application Ser. No. 17/034,459, filed Sep. 28, 2020 and entitled "High Density Capacitor Implemented Using Fin-FET", which is a Divisional of U.S. patent application Ser. No. 16/021,662, filed Jun. 28, 2018, entitled "High Density Capacitor Implemented Using Finfet" and issued on Sep. 29, 2020 as 10,790,352, each of which are hereby incorporated herein by reference in their respective entireties.

BACKGROUND

Background

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Capacitors can be formed on an IC chip. However, conventional methods of forming capacitors on an IC chip may require excessive amount of chip area, thereby leading to low capacitor density per unit area. As a result, device performance is not optimized.

Therefore, while existing capacitors on an IC and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 11 is a flow chart of a method for fabricating a FinFET device in accordance with embodiments of the present disclosure.

DETAILED DESCRIPTION

Figure 1:
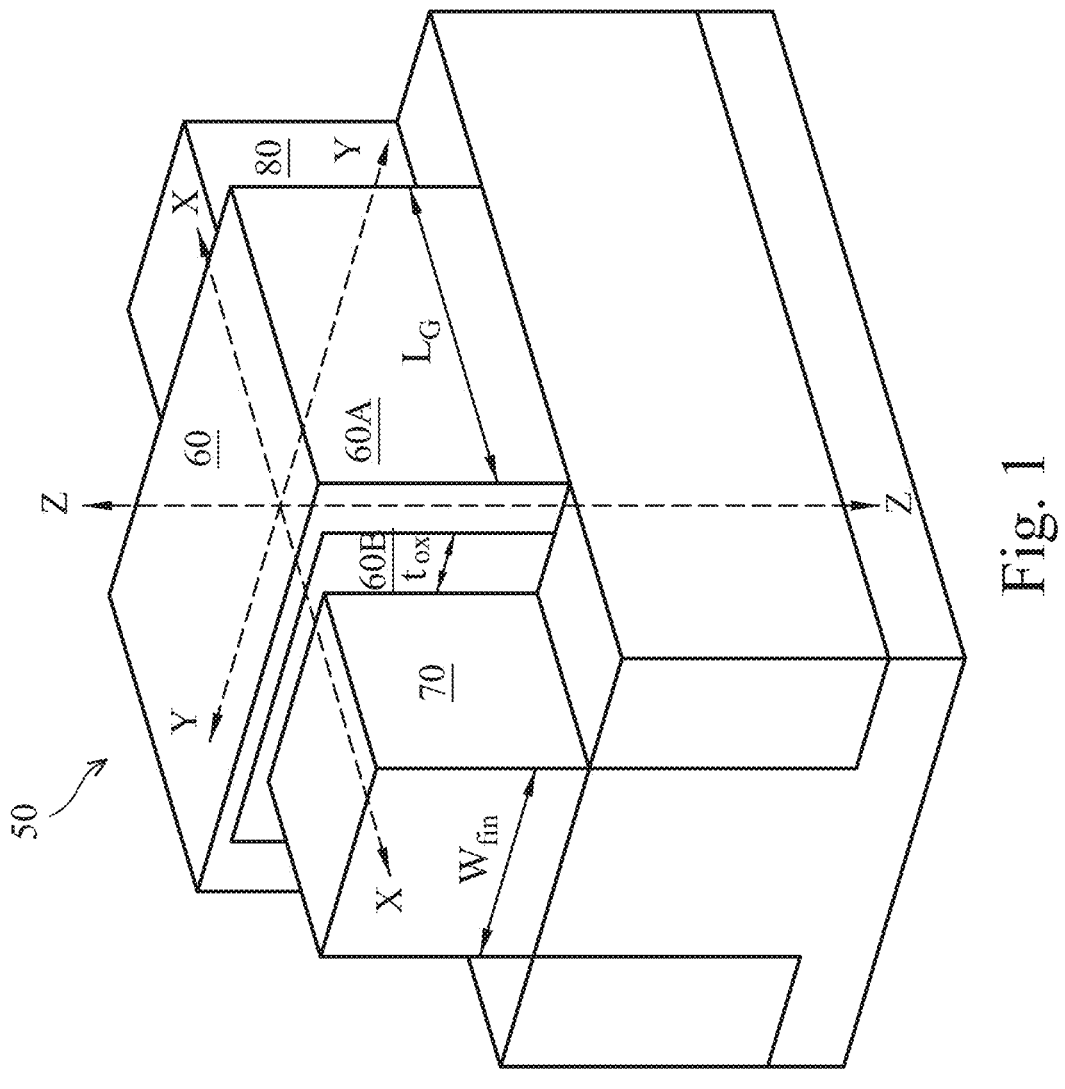
FIG. 1 is a perspective view of an example FinFET device.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure pertains to making capacitors through Integrated Circuit (IC) fabrication. According to various aspects of the present disclosure, a plurality of capacitors with enhanced density per unit area may be formed by various microelectronic components in fin-like field-effect transistor (FinFET) fabrication. It is understood, however, that the application should not be limited to a particular type of device, except as specifically claimed.

The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The use of FinFET devices has been gaining popularity in the semiconductor industry. Referring to FIG. 1, a perspective view of an example FinFET device 50 is illustrated. The FinFET device 50 is a non-planar multi-gate transistor that is built over a substrate (such as a bulk substrate). A thin silicon-containing "fin-like" structure forms the body of the FinFET device 50. The fin has a fin width $W_{fin}$. A gate 60 of the FinFET device 50 is wrapped around this fin. Lg denotes a length (or width, depending on the perspective) of the gate 60. The gate 60 may include a gate electrode component 60A and a gate dielectric component 60B. The gate dielectric 60B has a thickness $t_{ox}$. A portion of the gate 60 is located over a dielectric isolation structure such as shallow trench isolation (STI). A source 70 and a drain 80 of the FinFET device 50 are formed in extensions of the fin on opposite sides of the gate 60.

FinFET devices offer several advantages over traditional Metal-Oxide Semiconductor Field Effect Transistor (MOS-FET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

Figure 2:
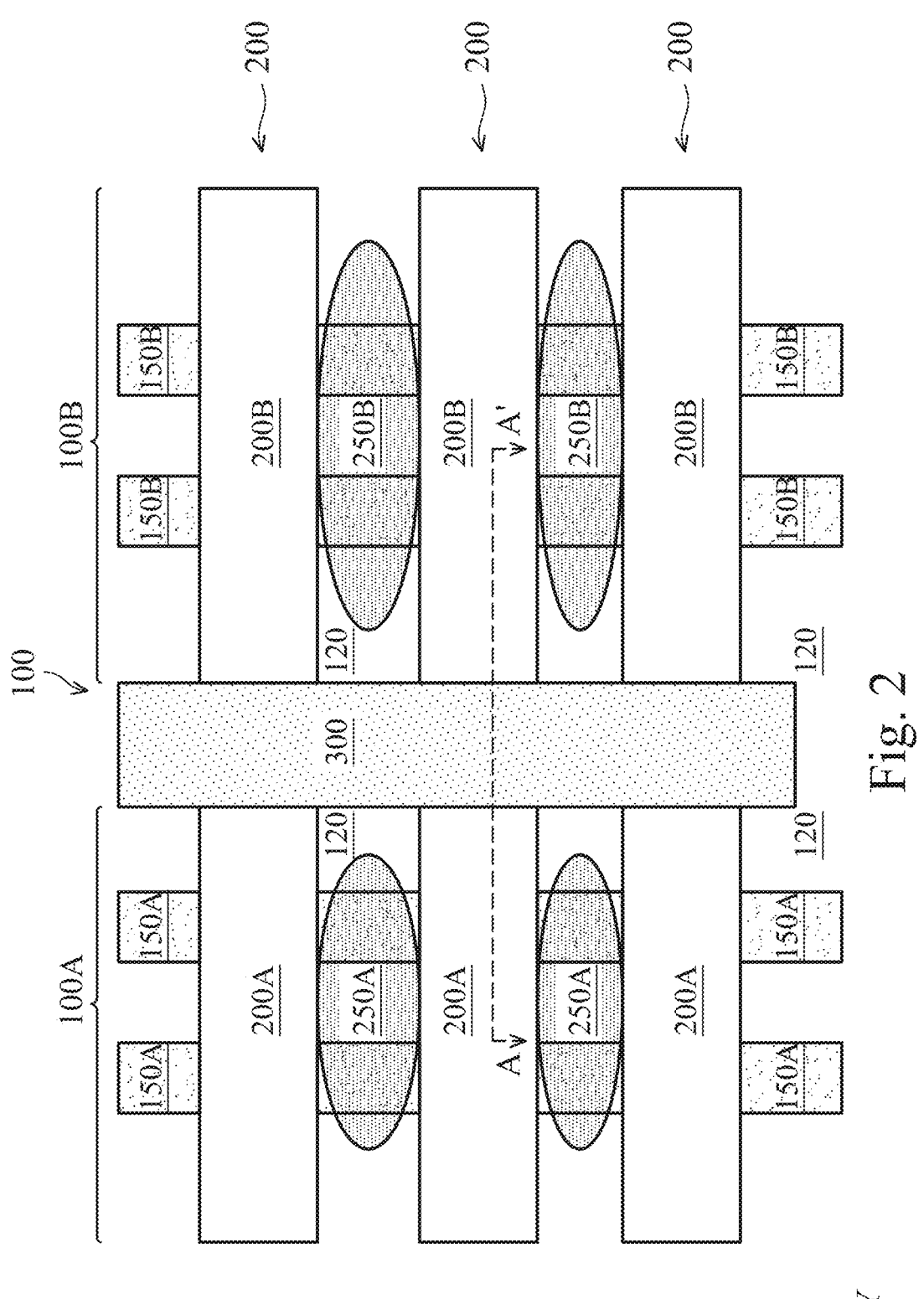
FIG. 2 is a top view of a portion of a FinFET device according to various embodiments of the present disclosure.

FIG. 2 illustrates a diagrammatic fragmentary top view of a portion of a FinFET device 100 that includes functional transistor components such as gates or source/drain regions. Referring to FIG. 2, the FinFET device 100 is fabricated over a substrate. In some embodiments, the substrate includes a semiconductor material such as silicon. Other suitable materials may also be used for the substrate in alternative embodiments. A semiconductor layer may be formed over the substrate. In an embodiment, the semiconductor layer includes a crystal silicon material. In other embodiments, the semiconductor layer may include silicon germanium. An implantation process (e.g., an anti-punch-through implantation process) may be performed to implant a plurality of dopant ions to the semiconductor layer. The dopant ions may include an n-type material in some embodiments, for example arsenic (As) or phosphorous (P), or they may include a p-type material in some other embodiments, for example boron (B), depending on whether an NMOS or a PMOS is needed. For the sake of illustration, the FinFET device 100 includes at least a FinFET device 100A and a FinFET device 100B. The FinFET device 100A and the FinFET device 100B may both be NFETs, or may both be PFETs, or may include an NFET and a PFET, respectively.

Dielectric isolation structures 120 such as shallow trench isolation (STI) are formed over portions of the semiconductor layer. The FinFET device 100 also includes a plurality of fin structures, for example fin structures 150A belonging to the FinFET device 100A and fin structures 150B belonging to the FinFET device 100B. The fin structures 150A and 150B may protrude upwardly in a Z-direction, where the Z-direction is orthogonal to a plane defined by a X-direction and a Y-direction shown in FIG. 2. In various embodiments, the fin structures 150A or 150B may include, but are not limited to, Si, SiGe, Ge, a III-V group compound, or graphene. Also as shown in the top view of FIG. 2, the fin structures 150A and 150B are elongated structures that each extend in the X-direction (i.e., the same X-direction that is shown in FIG. 1).

Gate structures 200 are formed over (and partially wrapping around) the fin structures 150A and 150B. The gate structures 200 include gate structures 200A for the FinFET device 100A and gate structures 200B for the FinFET device 100B. The gate structures 200A and 200B each extend in the Y-direction of FIG. 2 (i.e., the same Y-direction that is shown in FIG. 1).

In some embodiments, the gate structures 200 are high-k metal gate structures. The high-k metal gate structures may be formed in a gate replacement process, in which a dummy gate dielectric and a dummy gate electrode are replaced by a high-k gate dielectric and a metal gate electrode. A high-k dielectric material is a material having a dielectric constant that is greater than a dielectric constant of $SiO_2$, which is approximately 4. In an embodiment, the high-k gate dielectric includes hafnium oxide ($HfO_2$), which has a dielectric constant that is in a range from approximately 18 to approximately 40. In alternative embodiments, the high-k gate dielectric may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO.

The metal gate electrode may include a work function metal component and a fill metal component. The work functional metal component is configured to tune a work function of its corresponding FinFET to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the functional gate structure. In various embodiments, the fill metal component may contain Aluminum (Al), Tungsten (W), Copper (Cu), or combinations thereof.

The FinFET device 100 also includes source/drain regions, for example source/drain regions 250A for the FinFET device 100A and source/drain regions 250B for the FinFET device 100B. The source/drain regions 250A and 250B may each be formed using one or more epitaxial growth processes, and as such they are epitaxially-grown structures. In various embodiments, the source/drain regions 250A or 250B may include, but are not limited to, Si, SiP, SiAs, SiGe, Ge, a III-V group compound semiconductor, or graphene.

An inter-layer dielectric (ILD) may be formed over the dielectric isolation structures 120 and over portions of the fin structures 150A and 150B. In some embodiments, the ILD may include a low-k dielectric material. In some other embodiments, the ILD may contain silicon oxide. The ILD may be formed by a suitable deposition process followed by a polishing process such as chemical-mechanical-polishing (CMP), so as to planarize the upper surface of the ILD.

The FinFET device 100 also includes isolation structures 300. As shown in the top view of FIG. 2, the isolation structure 300 is elongated and extends in the X-direction (i.e., the same X-direction shown in FIG. 1). Due to its position of being located in between the FinFET devices 100A and 100B, the isolation structure 300 provides electrical isolation between the FinFET devices 100A and 100B, for example electrical isolation between the gate structures 200A and 200B. Good electrical isolation between the gate structures 200A and 200B will result in lower noise or interference between the FinFET devices 100A and 100B, and thus better performance of the FinFET device 100 as a whole.

It is understood that prior to the formation of the isolation structures 300, each set of the gate structures 200A and 200B are continuous in the Y-direction (e.g., joined together). For example, each set of gate structures 200A and 200B may be a single piece of gate structure, and then the isolation structures 300 may be formed by etching an opening or a trench in each of the continuous gate structures and then filling the etched opening or trench with an electrically insulating material, for example a dielectric material. Since each isolation structure 300 is formed by "cutting through" what would have been a continuous gate structure, the isolation structure 300 may be interchangeably referred to as a cut-metal-gate (CMG) structure hereinafter. In contrast, conventional isolation structures (for providing electrical isolation between adjacent gate structures) are formed before the gate structure (e.g., the high-k metal gate structure) is formed. Due to the differences in the order/sequence of the formation of the gate isolation structures between conventional methods and the present disclosure, the present disclosure offers improved footprint or greater feature density per unit area compared to conventional FinFET devices.

To facilitate the understanding of the present disclosure (e.g., involving using the isolation structures 300 to implement high density capacitors), the formation of the isolation structure 300 is briefly discussed below with reference to FIGS. 3-6. In that regard, FIGS. 3-6 are fragmentary cross-sectional side views of a portion of the FinFET device 100 at different stages of fabrication, where the cross-section is taken along a cut-line defined by A-A' in FIG. 2.

Figure 3:
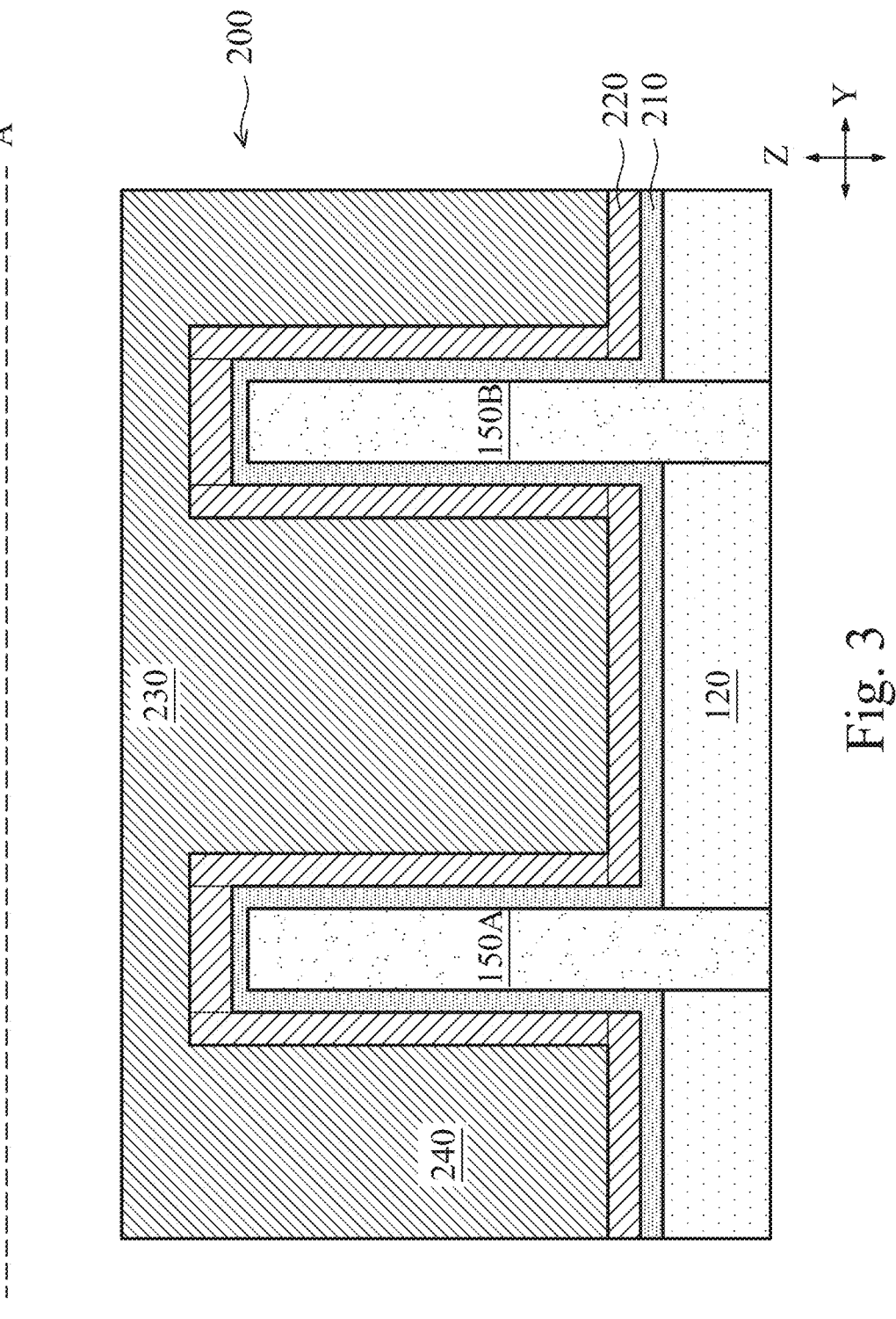
FIGS. 3-6 are cross-sectional side views of a portion of a FinFET device at different stages of fabrication according to various embodiments of the present disclosure.

Referring to FIG. 3, the fin structures 150A and 150B protrude upwardly in the Z-direction out of the dielectric isolation structure 120 (e.g., STI). The gate structure 200 is formed over the fin structures 150A and 150B, for example by partially wrapping around the fin structures 150A and 150B. The gate structure 200 includes a gate dielectric 210. In some embodiments, the gate dielectric 210 may include a high-k dielectric material discussed above. The gate structure 200 also includes a gate electrode that is formed over the gate dielectric 210. The gate electrode includes a work function metal component 220 and a fill metal component 230. As discussed above, the work function metal component 220 is configured to tune a work function of the corresponding transistor, and the fill metal component 230 is configured to serve as the main conductive portion of the gate electrode.

It is understood that an interfacial layer may be formed between the gate dielectric 210 and the fin structures 150A and 150B. However, for reasons of simplicity, the interfacial layer is not specifically illustrated. It is also understood that the gate structure 200 is surrounded by (or embedded within) an ILD, but due to the location of the cut-line A-A', the ILD is not directly visible in the cross-sectional view shown in FIG. 3. At the stage of fabrication shown in FIG. 3, the gate structure 200 is continuous in the Y-direction and has not been "cut" yet.

Figure 4:
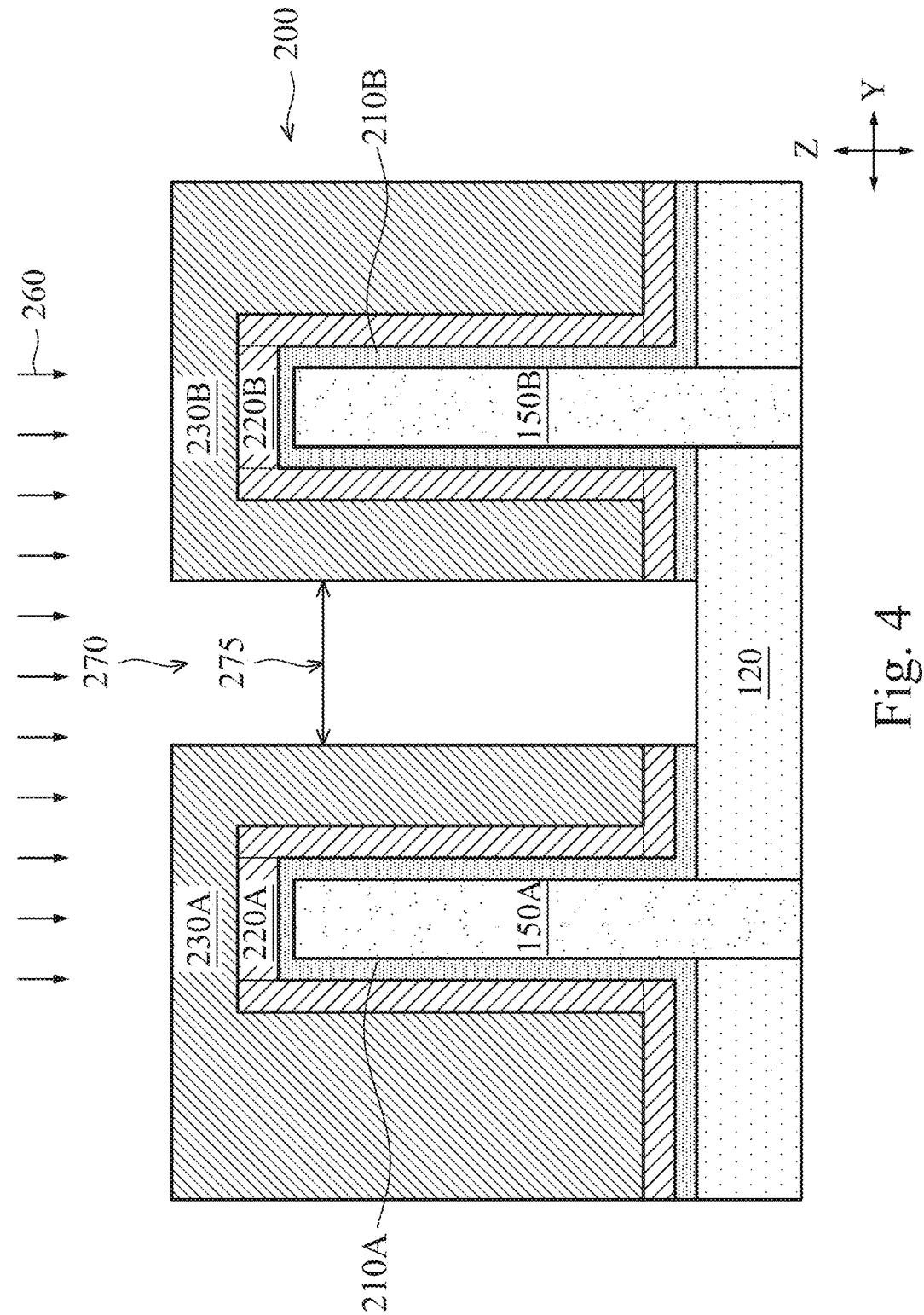

Referring now to FIG. 4, one or more etching processes 260 may be performed to etch an opening or trench 270. The trench 270 extends vertically in the Z-direction through the gate structure 200, including through the fill metal component 230, the work function metal component 220, and the gate dielectric 210. The trench 270 "cuts" or "severs" the continuous gate structure 200 into two distinct parts: one part including the gate dielectric 210A, the work function metal component 220A, and the fill metal component 230A, and the other part including the gate dielectric 210B, the work function metal component 220B, and the fill metal component 230B. The trench 270 is formed to have a lateral dimension 275 that is measured in the Y-direction. The lateral dimension is small, for example it may be in a range between about 20 nm and about 30 nm in some embodiments. The small size of the lateral dimension 275 of the trench 270 reduces chip area, or increases feature density per unit area.

Figure 5:
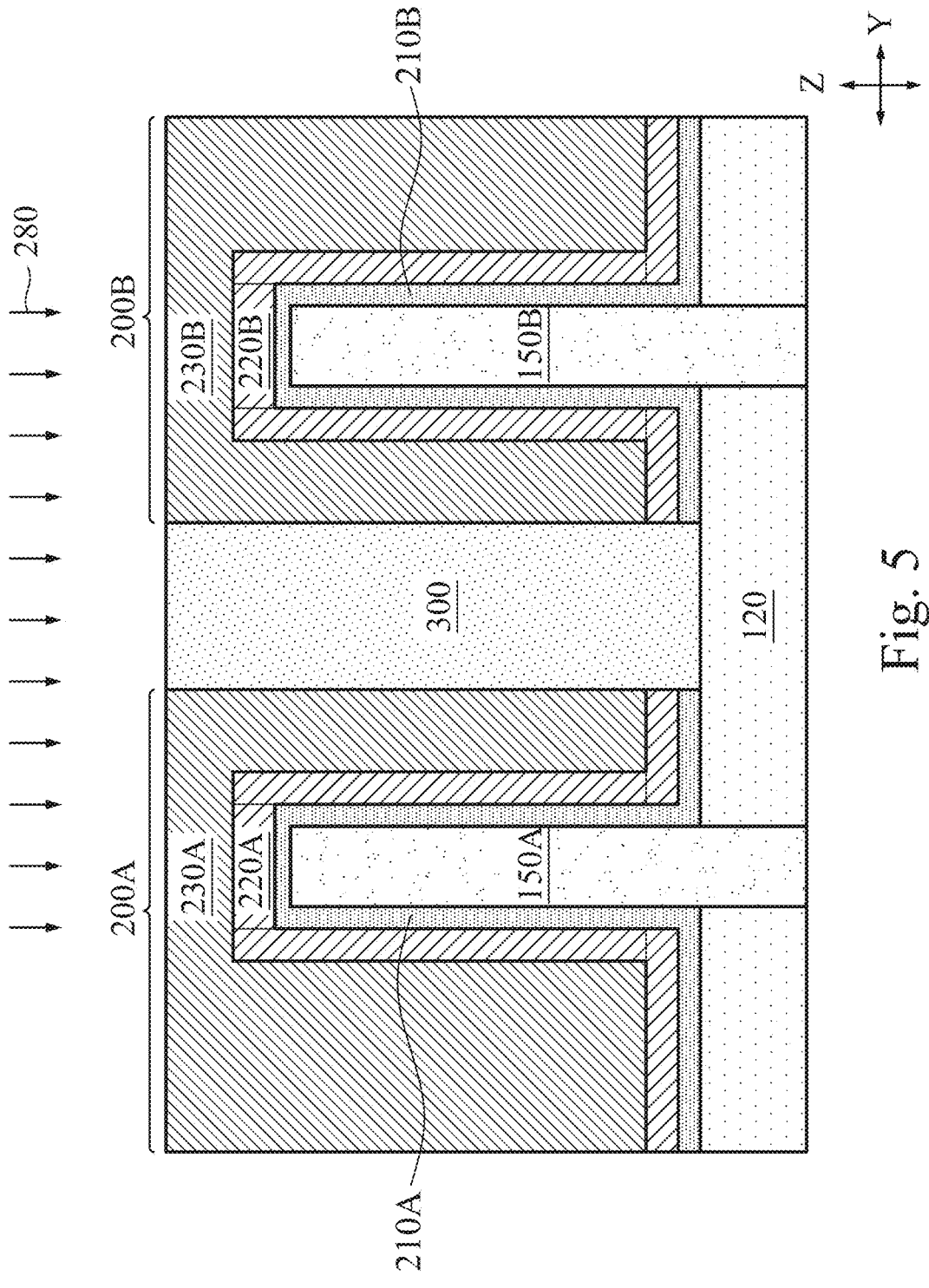
Figure 6:
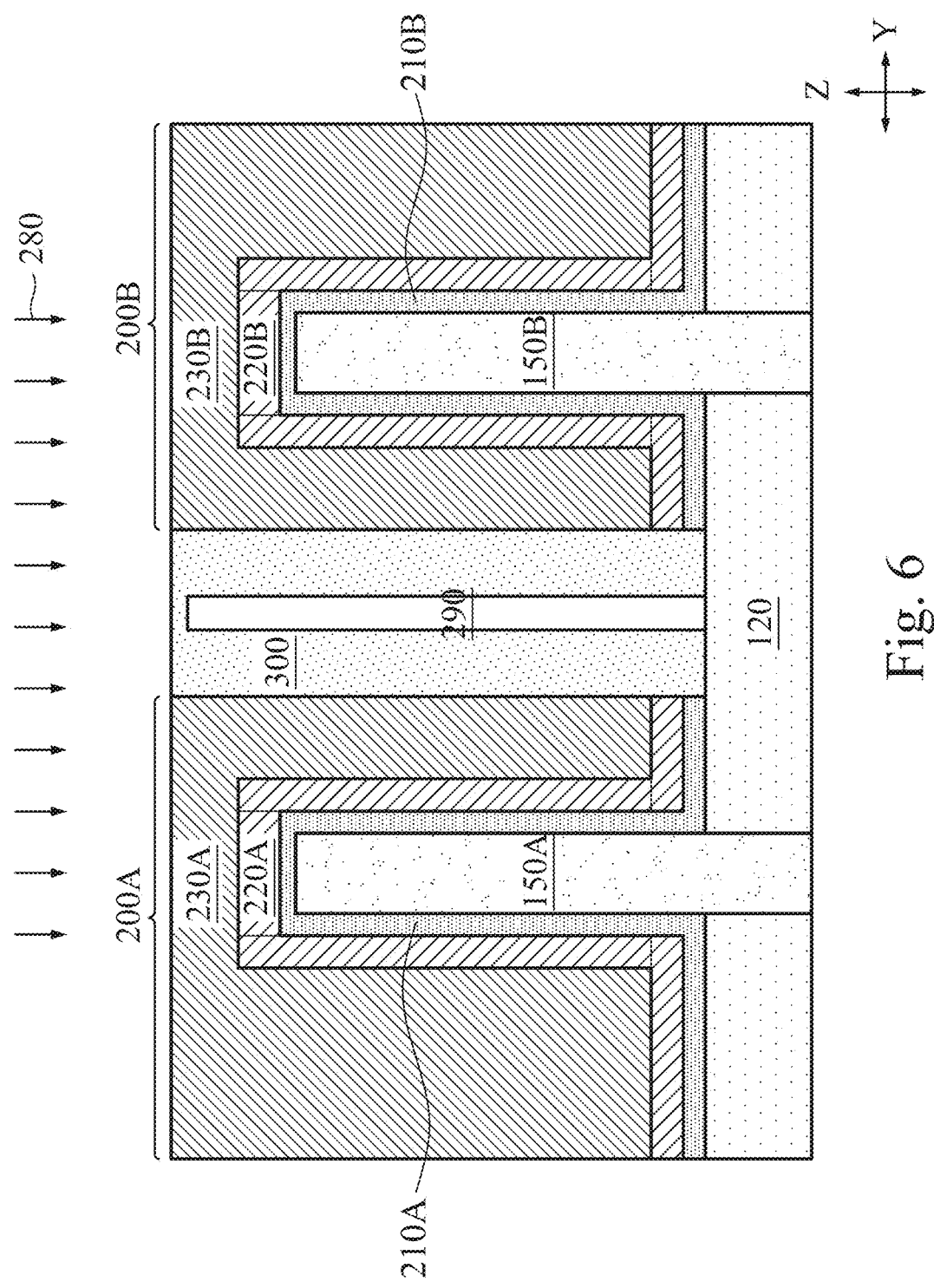

Referring now to FIG. 5, one or more deposition and polishing processes 280 may be performed to form the isolation structure 300 in the trench 270. For example, a deposition process is first performed to deposit a dielectric material into the trench 270. In some embodiments, the dielectric material has a good gap-filling or recess-filling characteristic. This is so that the deposited dielectric material can still effectively fill the trench 270, even though the trench has a small lateral dimension 275. In some embodiments, the dielectric material is deposited using an atomic layer deposition (ALD) process, which may be slow but offers good gap-filling performance. In other embodiments, the dielectric material may be deposited using a plasma enhanced chemical vapor deposition (PECVD) process. One or more polishing processes such as a chemical mechanical polishing (CMP) process may then be performed as a part of the processes 280 to planarize the upper surface of the deposited dielectric material, thereby forming the isolation structure 300.

In some embodiments, the isolation structure 300 may comprise a single type of dielectric material, such as silicon oxide, a low-k oxide, or $Al_2O_3$. Note that even when the isolation structure 300 comprises a single type of dielectric material, it may still have different physical characteristics from other components that comprise the same type of dielectric material, because the other components may be formed using different processes. For example, shallow trench isolation (STI) (e.g., the structure 120) may comprise silicon oxide, as does the isolation structure 300 in some embodiments. However, the silicon oxide of the STI may be formed by flowable chemical vapor deposition (FCVD), which is different than the PECVD or ALD that forms the silicon oxide of the isolation structure 300. As a result, the silicon oxide of the STI and the silicon oxide of the isolation structure 300 may have different characteristics such as density, or etching rate.

In some other embodiments, the deposition process to form the isolation structure 300 may include a plurality of processes in which a plurality of different layers/materials may be deposited into the trench 270. For example, the isolation structure 300 may comprise a multi-layer or multi-stack structure with a plurality of layers formed one over another. Since the material composition and the thicknesses of each of the layers in the multi-stack structure is configurable, the overall dielectric constant (k) value of the isolation structure 300 may be specifically configured to optimize the functionality of the isolation structure 300, which is to provide electrical isolation between adjacent gate structures 200A and 200B.

As an embodiment of the multi-stack structure, the isolation structure 300 may include a first layer and a second layer deposited on the second layer, where the first layer and the second layer have different material compositions. In some embodiments, the first layer may include $SiO_2$, SiON, SiOCN, SiCN, SiN, or combinations thereof, and the second layer may include $SiO_2$, SiC, or combinations thereof. The first layer may have good gap filling performance, as discussed above, while the second layer is not as concerned with the gap-filling performance, since the trench 270 may have already been substantially filled by the first layer. In some embodiments, the purpose of the second layer is to provide a flat or smooth upper surface. Thus, the second layer can be a cheaper material, and its deposition may be performed using a process that is not as costly or time-consuming as the ALD process used to form the layer. For example, the second layer may be deposited over the first layer using a process such as chemical vapor deposition (CVD), such as a plasma enhanced CVD (PECVD) process. In some embodiments, the deposition of the second layer may leave one or more seams or air gap 290 trapped within the isolation structure 300, such as that shown in FIG. 6. Since air has a low dielectric constant, the presence of the one or more air gaps 290 could improve the low-k dielectric properties of the isolation structure 300.

Additional details of the isolation structure 300 and the formation thereof are disclosed in U.S. patent application Ser. No. 15/941,137, filed on Mar. 30, 2018, entitled "An Isolation Structure Having Different Distances to Adjacent FinFET Devices", the disclosure of which is hereby incorporated by reference in its entirety. It is understood that in some embodiments, the isolation structure 300 (or another isolation structure formed similar to the isolation structure 300) may also be used to provide electrical isolation between adjacent conductive contacts. In other words, a continuous conductive contact line may be "cut-through" and filled by one or more dielectric materials to form what may be referred to as a "cut-slot-contact" (or CSC) structure. In other embodiments, however, the CSC structure may simply comprise an ILD material that surrounds the conductive contacts, and that the conductive contacts are not specifically "cut open" and filled with a dielectric material in order to form the CSC structures.

According to the various aspects of the present disclosure, the CMG structures and the CSC structures may be utilized to form densely-packed capacitor devices, as discussed below in more detail with reference to FIGS. 7-10. In that regard, FIG. 7 illustrates a diagrammatic fragmentary top view of another portion of the FinFET device 100 (hereinafter referred to as FinFET device 100C) that includes the CMG and CSC structures, FIG. 8 illustrates a cross-sectional side view of the FinFET device 100C taken from a cut-line of M-M', FIG. 9 illustrates another cross-sectional side view of the FinFET device 100C taken from a cut-line of N-N', and FIG. 10 illustrates a three-dimensional (3D) perspective view of a selected region 400 (the outline of which is shown as a dashed-line box) of the FinFET device 100C.

Figure 7:
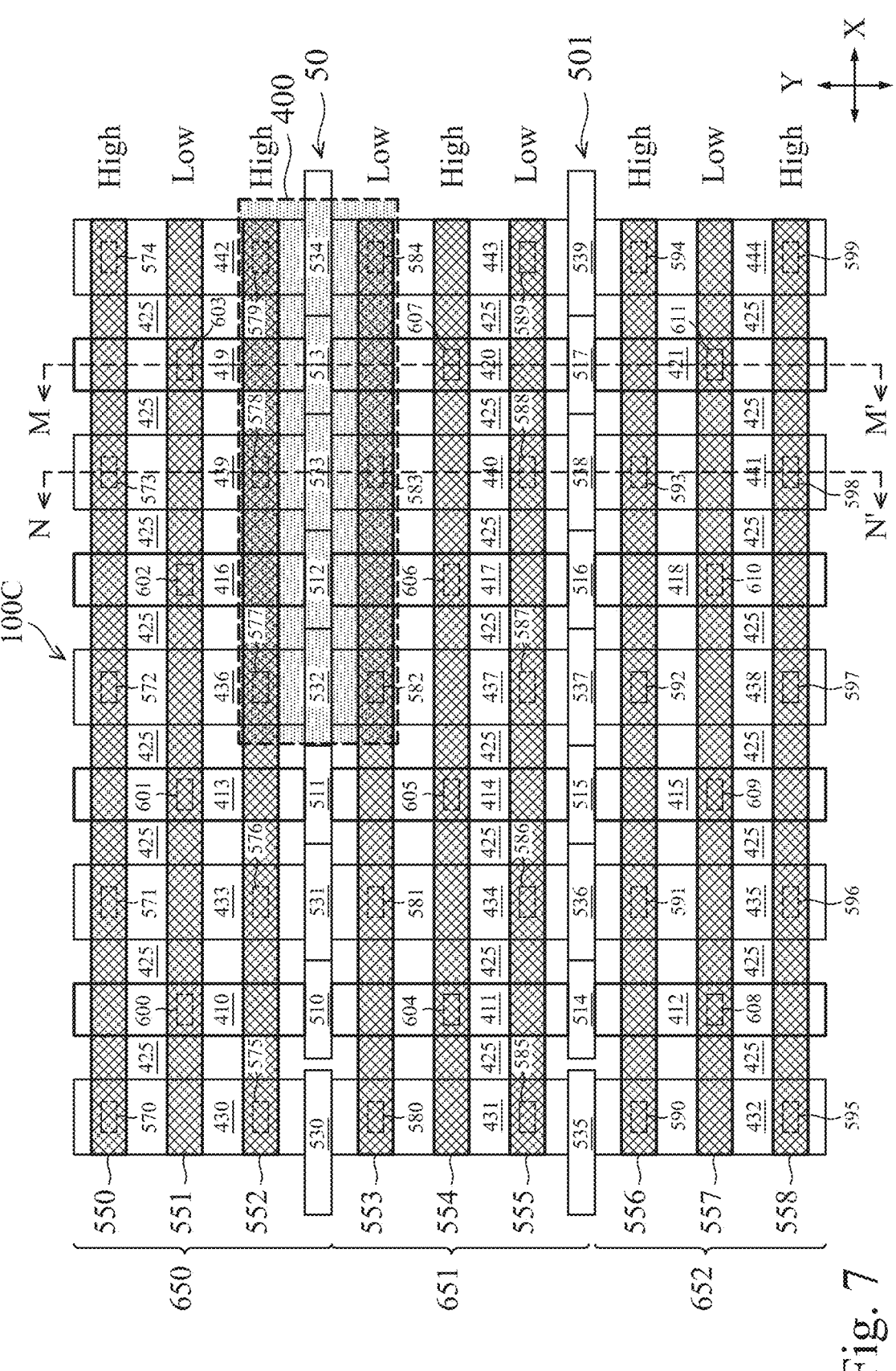
FIG. 7 is a top view of a portion of a FinFET device on which capacitors are implemented according to various embodiments of the present disclosure.

Referring to FIG. 7, the portion of the FinFET device 100C includes a plurality of gate structures, for example gate structures 410-421, that each extend in an elongated manner in the Y-direction. The sets of gate structures 410-412, 413-415, 416-418, and 419-421 are also spaced apart from one another in the X-direction by portions of an ILD 425. The gate structures 410-421 may be formed using the same fabrication process that form the gate structures 200. For example, the gate structures 410-421 may be formed by a gate replacement process and may each include a high-k gate dielectric and a metal gate electrode. In some embodiments, the gate structures 410-421 may each have a lateral dimension (measured in the X-direction) that is in a range between about 10 nm and about 30 nm. However, since the gate structures 410-421 are formed over an isolation region (such as STI or dummy fins as discussed below), there may be no fins available for the gate structures 410-421 to wrap around. Therefore, it is understood that the gate structures 410-421 may not necessarily take on the same structure as the gate structures discussed above in association with FIGS. 1-6, but that they may be formed using the same fabrication process flow as the gate structures discussed above in association with FIGS. 1-6, in order to realize the capacitor structure of the present disclosure discussed below.

The portion of the FinFET device 100C also includes a plurality of conductive contacts, for example conductive contacts 430-444, that each extend in an elongated manner in the Y-direction. The sets of conductive contacts 430-432, 433-435, 436-438, 439-441, and 442-444 are also spaced apart from one another in the X-direction by portions of the ILD 425. The conductive contacts 430-444 are formed using the same fabrication processes that form conductive contacts for source/drain regions (e.g., the source/drain regions 250A or 250B shown in FIG. 2). In various embodiments, the conductive contacts 430-444 may include a conductive material such as copper, aluminum, tungsten, or alloys and/or combinations thereof. In some embodiments, the conductive contacts 430-444 may each have a lateral dimension (measured in the X-direction) that is in a range between about 20 nm and about 40 nm. In some embodiments, a spacing (measured in the X-direction) between each pair of adjacently located gate structure and conductive contact (e.g., the gate structure 419 and conductive contact 439) is in a range between about 15 nm and about 35 nm.

Figure 8:
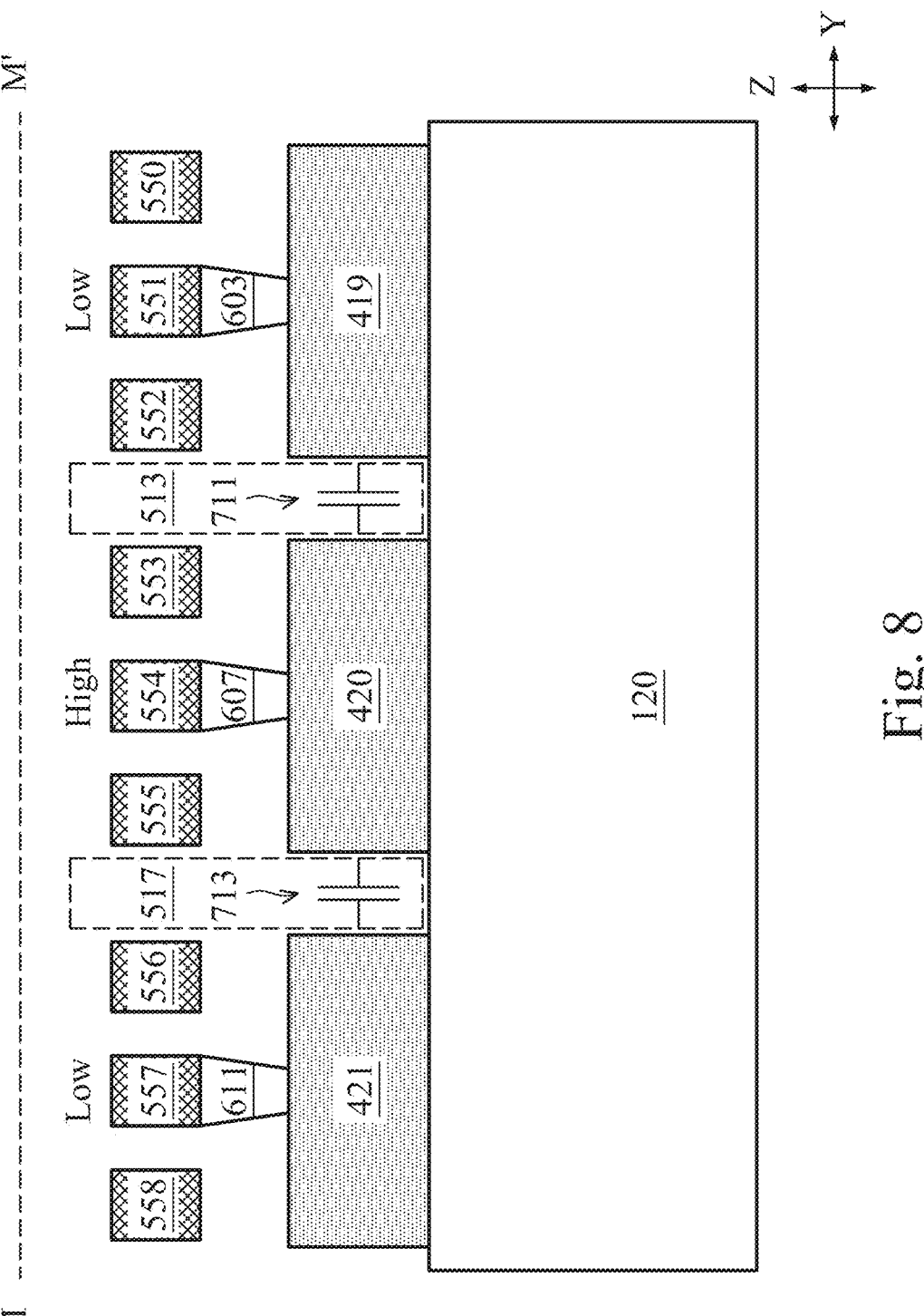
FIGS. 8-9 are cross-sectional side views of the portion of the FinFET device shown in FIG. 7 according to various embodiments of the present disclosure.
Figure 9:
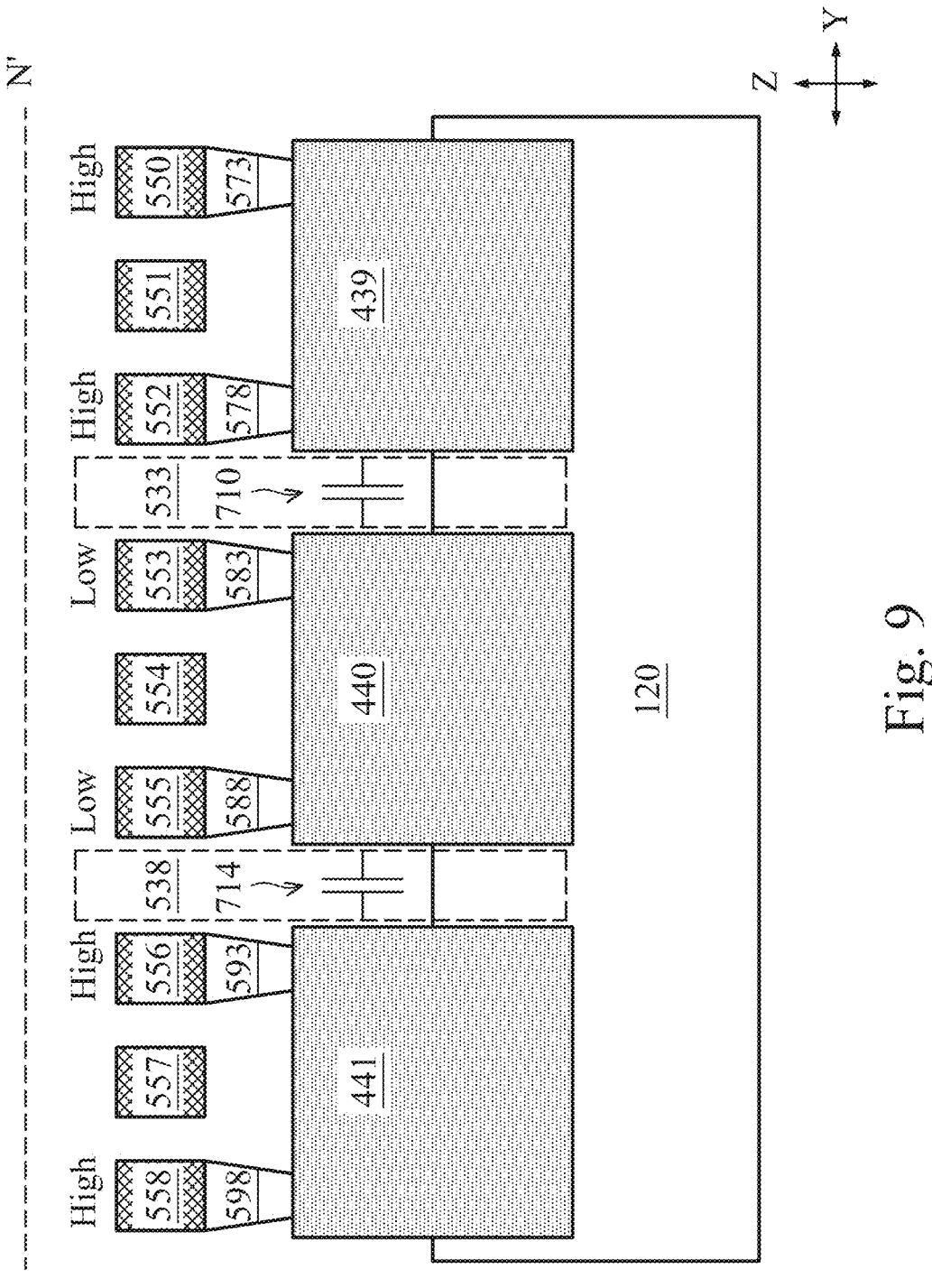
Figure 10:
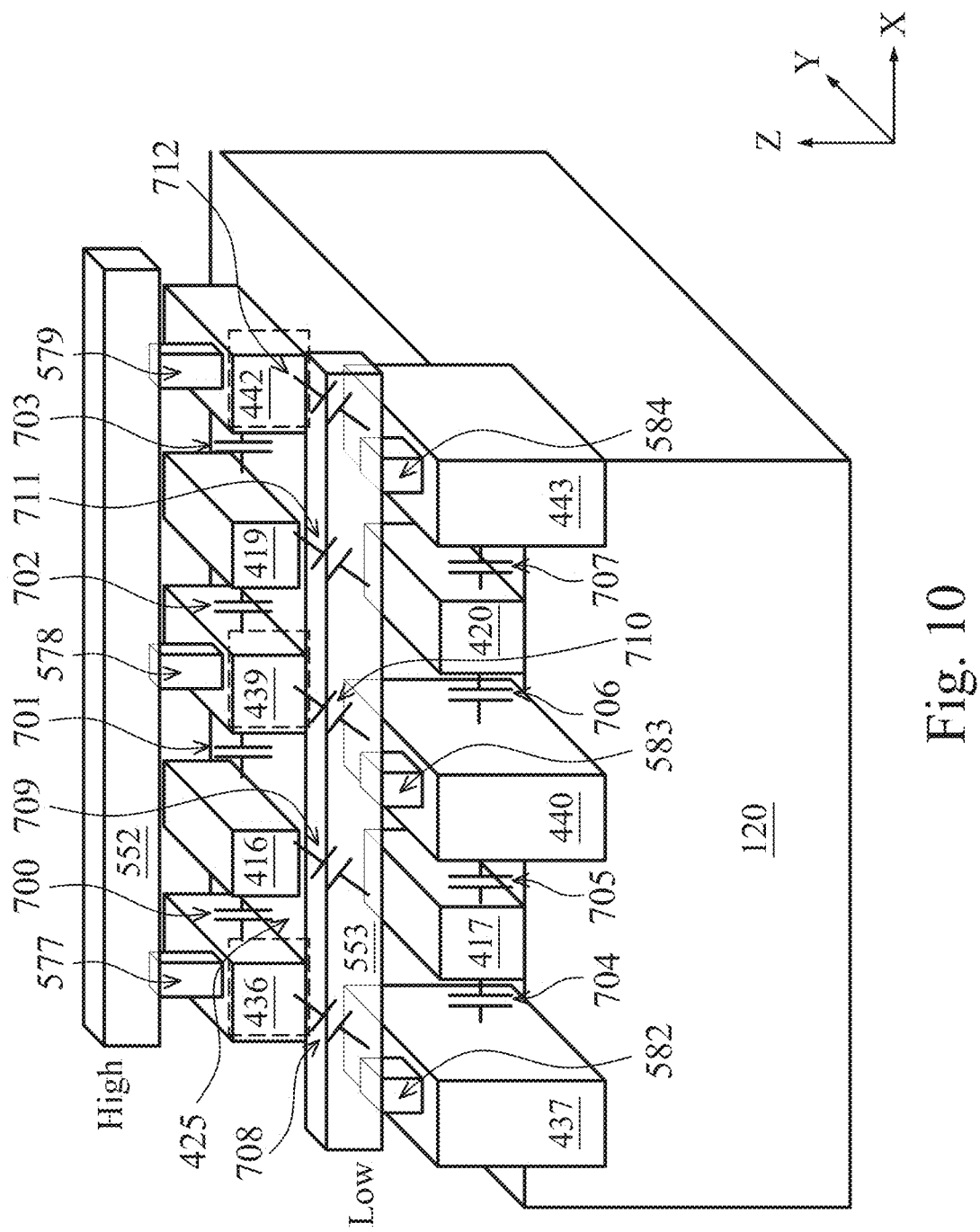
FIG. 10 is a three-dimensional perspective view of a region of the FinFET device shown in FIG. 7 according to various embodiments of the present disclosure.

According to the various aspects of the present disclosure, the gate structures 410-421 and the conductive contacts 430-444 are located over an electrically insulating structure, for example the dielectric structure 120 (e.g., STI) as shown in FIGS. 8-10, or another suitable dielectric material, or a dummy fin (also referred to as a hybrid fin) that is formed over the an STI. The dummy fin may include a nitride material or a high-k material, for example. As shown in FIG. 10, portions of each of the conductive contacts 430-444 may partially extend downwardly (in the Z-direction) into the dielectric isolation structure 120.

The portion of the FinFET device 100C further includes isolation structures 500 and 501, which extend in an elongated manner along the X-direction. The isolation structure 500 is disposed between the gate structures 410-411, 413-414, 416-417, and 419-420, as well as between the conductive contacts 430-431, 433-434, 436-437, 439-440, and 442-443. The isolation structure 501 is disposed between the gate structures 411-412, 414-415, 417-418, and 420-421, as well as between the conductive contacts 431-432, 434-435, 437-438, 440-441, and 443-444.

It is understood that although the isolation structures 500-501 are each illustrated as a continuous structure, they may each actually be discontinuous and include a plurality of distinct or different isolation structures instead. For example, the isolation structure 500 may include CMG structures 510-513, and the isolation structure 501 may include CMG structures 514-517. The CMG structures 510-517 may be embodiments of the isolation structure 300 discussed above and may be formed using processes similar to those discussed above with reference to FIGS. 3-6. In other words, the CMG structures 510-517 "cut through" what would have been continuous gate lines, and as a result separate and provide electrical isolation between the gate structures 410-411, 413-414, 416-417, 419-420, 411-412, 414-415, 417-418, and 420-421, respectively.

The isolation structure 500 may also include cut-slot-contact (CSC) structures 530-534, and the isolation structure 501 may include CSC structures 535-539. In some embodiments, the CSC structures 530-539 may comprise the ILD material surrounding the conductive contacts 430-444. In other words, the CSC structures 530-539 may be "formed" by the time the conductive contacts 430-444 are formed (e.g., by virtue of the ILD material surrounding the conductive contacts). In some embodiments, however, the CSC structures 530-539 may also be formed by etching openings into continuous conductive contact lines (to break up the conductive contact lines) and filling the openings with a dielectric material, similar to how the CMG structures 510-517 are formed.

The CMG structures 510-517 and the CSC structures 530-539 may have different material compositions. For example, whereas the CSC structures 530-539 may include the same material as the ILD (e.g., a low-k dielectric), the CMG structures 510-517 may include silicon nitride or silicon oxide in some embodiments, or multiple different materials in other embodiments. It is also understood that the CMG structures 510-517 and the CSC structures 530-539 may have different dimensions in the X-direction and/or the Y-direction, and they may misaligned with respect to one another as well. In addition, the CMG structures 510-517 are not necessarily contiguous to the CSC structures 530-439 in the X-direction.

The FinFET device 100C further includes a plurality of metal lines 550-558. As shown in FIG. 7, the metal lines 550-552 are disposed over the gate structures 410, 413, 416, and 419, as well as over the conductive contacts 430, 433, 436, 439, and 442. The metal lines 553-555 are disposed over the gate structures 411, 414, 417, and 420, as well as over the conductive contacts 431, 434, 437, 440, and 443. The metal lines 556-558 are disposed over the gate structures 412, 415, 418, and 421, as well as over the conductive contacts 432, 435, 438, 441, and 444.

The metal lines 550-558 are metal lines of a multi-layered interconnect structure. For example, the metal lines 550-558 may be metal lines from a metal-0 (M0) interconnect layer. In various embodiments, the metal lines 550-558 may include a conductive material such as copper, aluminum, tungsten, or alloys and/or combinations thereof.

The metal lines 550-558 are arranged in an alternating configuration. In more detail, a first group of the metal lines 550, 552, 554, 556, and 558 are each electrically tied to an electrically "High" node, while a second group of the metal lines 551, 553, 555, and 557 are electrically tied to an electrically "Low" node. In some embodiments, the "High" node and the "Low" node represent different groups of electrodes, and they could have any voltage (as long as the voltages are different between the "High" node and the "Low" node), depending on the application and as long as reliability requirement is passed. For example, in one embodiment, an electrically "high" signal (e.g., a first voltage) may be applied to the "High" node, and an electrically "Low" signal (e.g., electrical ground or a second voltage lower than the first voltage) may be applied to the "Low" node.

The gate structures 410-421 and the conductive contacts 430-444 are electrically coupled to the metal lines 550-558 through a plurality of vias 570-611. For example, the conductive contacts 430, 433, 436, 439, and 442 are electrically connected to the metal line 550 through the vias 570-574, respectively, as well as being electrically connected to the metal line 552 through the vias 575-579, respectively; the conductive contacts 431, 434, 437, 440, and 443 are electrically connected to the metal line 553 through the vias 580-584, respectively, as well as being electrically connected to the metal line 555 through the vias 585-589, respectively; and the conductive contacts 432, 435, 438, 441, and 444 are electrically connected to the metal line 556 through the vias 590-594, respectively, as well as being electrically connected to the metal line 558 through the vias 595-599, respectively. Meanwhile, the gate structures 410, 413, 416, and 419 are electrically connected to the metal line 551 through the vias 600-603; the gate structures 411, 414, 417, and 420 are electrically connected to the metal line 554 through the vias 604-607; the gate structures 412, 415, 418, and 421 are electrically connected to the metal line 557 through the vias 608-611.

Based on the above discussions, it can be seen that the gate structures 410-421 and the conductive contacts 430-444 are electrically connected to the "High" and "Low" nodes in an alternating configuration, which is one of the unique characteristics of the FinFET device 100C. For example, the portion of the FinFET device 100C illustrated in FIG. 7 includes a unit 650, a unit 651 disposed adjacent to the unit 650 (e.g., "below" the unit 650 in the Y-direction), and a unit 652 disposed adjacent to the unit 651 (e.g., "below" the unit 651 in the Y-direction). For the unit 650, the "High" node is electrically connected to the conductive contacts 430, 433, 436, 439, and 442, while the "Low" node is electrically connected to the gate structures 410, 413, 416, and 419. However, for the unit 651, the "Low" node is electrically connected to the conductive contacts 431, 434, 437, 440, and 443, while the "High" node is electrically connected to the gate structures 411, 414, 417, and 420.

In other words, the "High" node is tied to the conductive contacts in one unit but is tied to the gate structures in an adjacent unit, while the "Low" node is tied to the gate structures in one unit but is tied to the conductive contacts in the adjacent unit. This alternating pattern may repeat a plurality of times. For example, the unit 652 (the isolation structure of which is not specifically illustrated herein for reasons of simplicity) may have the same electrical configuration as the unit 650, and it is understood that another unit configured the same as the unit 651 may also be disposed "below" the unit 652 in the Y-direction. In this manner, the FinFET device 100C is scalable in the Y-direction. Similarly, the FinFET device 100C is also scalable in the X-direction, as the interleaving arrangement of the gate structures and conductive contacts and their connections to the metal lines located thereover may also repeat in the X-direction.

The alternating electrical routing configuration of the gate structures and conductive contacts to the "High" and "Low" nodes of the present disclosure provides high density capacitors, as it allows capacitors to be formed in both the X-direction and the Y-direction. This is illustrated in more detail in the cross-sectional views of FIGS. 8-9 and in the 3D perspective view of FIG. 10. For example, as shown in FIG. 10, a plurality of capacitors 700-712 is formed. The capacitor 711 is also visible in FIG. 8, along with a similarly-formed capacitor 713. The capacitor 710 is also visible in FIG. 9, along with a similarly-formed capacitor 714. Some of these capacitors 710-714 are formed by a conductive contact, an adjacent gate structure, and the dielectric material disposed therebetween, while some other ones of these capacitors are formed by adjacently located conductive contacts and the dielectric material disposed therebetween, or by adjacently located gate structures and the dielectric material disposed therebetween.

For example, as shown in FIGS. 8 and 10, the capacitor 711 is defined by the adjacently located gate structures 419-420 and the CMG structure 513 (shown in FIG. 8 but not specifically illustrated in FIG. 10 for reasons of simplicity) disposed between the gate structures 419-420. As shown in FIG. 7, one terminal—the gate structure 419—of the capacitor 711 is electrically tied to the "Low" node, while the other terminal—the gate structure 420—of the capacitor 711 is electrically tied to the "High" node. The gate structures 419-420's electrical connections to opposite electrical nodes, along with the dielectric material (the CMG structure 513) disposed therebetween, create a desirable parasitic capacitance effect, thereby generating the capacitor 711. Had the adjacently located gate structures 419-420 not been tied to the different electrical nodes with an electrical potential in between, no capacitor (at least not a desirable one) would have been formed.

Similarly, the capacitor 710 (shown in FIGS. 9-10) is defined by the adjacently located conductive contacts 439-440 and the CSC structure 533 (shown in FIG. 9 but not specifically illustrated in FIG. 10 for reasons of simplicity) disposed between conductive contacts 439-440. As shown in FIG. 7, one terminal—the conductive contact 439—of the capacitor 710 is electrically tied to the "High" node, while the other terminal—the conductive contact 440—of the capacitor 710 is electrically tied to the "Low" node. The conductive contacts 439-440's electrical connections to opposite electrical nodes, along with the dielectric material (the CSC structure 533) disposed therebetween, create a desirable parasitic capacitance effect, thereby generating the capacitor 710. Had the adjacently located conductive contacts 439-440 not been tied to different electrical nodes with an electrical potential in between, no capacitor (at least not a desirable one) would have been formed.

In addition to defining capacitors (e.g., capacitors 710 and 711) in the Y-direction, the FinFET device 100C also defines capacitors in the X-direction. For instance, as shown in FIG. 10, the capacitors 700-707 are each defined in the X-direction by adjacently located pairs of a conductive contact and a gate structure. Using the capacitor 700 as a non-limiting example, it is defined the conductive contact 436, the adjacently located gate structure 416, and the portion of the ILD 425 disposed therebetween. One terminal—the conductive contact 436—of the capacitor 700 is electrically tied to the "High" node, while the other terminal—the gate structure 416—of the capacitor 700 is electrically tied to the "Low" node (this is more apparent in FIG. 7). Similarly, the capacitors 701-707 each have their two terminals (where one terminal is a conductive contact while the other terminal is a gate structure) tied to different nodes. As discussed above, the fact that the two terminals of each of the capacitors 700-707 are electrically coupled to different nodes (e.g., with different voltage potentials) makes the capacitors 700-707 possible. Had the two terminals been tied to the same node, no desirable capacitor would have been formed.

Based on the above discussions, it can be seen that the unique electrical configuration of the various structures of FinFET device 100C effectively forms capacitors in both the X-direction and in the Y-direction. A capacitor may be defined by: each adjacent pair of conductive contacts (adjacent in the Y-direction), each adjacent pair of gate structures (adjacent in the Y-direction), and each adjacent pair of conductive contact and gate structure (adjacent in the X-direction). The result is a much more densely packed capacitor array compared to conventional capacitors on an IC. The capacitance values of the capacitors defined in the Y-direction may be tuned by configuring the sizes of the CMG structures 510-517 and the CSC structures 530-539, for example their dimensions in the Y-direction. The capacitance values of the capacitors defined in the X-direction may be tuned by configuring the X-direction distance between pairs of adjacently located conductive contact and gate structure.

In addition to providing a densely packed capacitor array whose capacitor values can be flexibly tuned, the present disclosure also provides enhanced uniformity control. This is because unlike conventional processes, the "High" nodes are not all tied to the same type of structure, nor are the "Low" nodes all tied to the same type of structure. Instead, some of the "High" nodes are electrically tied to the conductive contacts, while the other "High" nodes are electrically tied to the gate structures, in an alternating configuration. The same is true for the "Low" nodes. As such, the present disclosure offers better uniformity control through an averaging effect. For example, process variations or other imperfections that affect a particular type of structure—being it the conductive contacts, or the gate structures—will not adversely impact one type of node much more so than the other type of node. Instead, the process variations or imperfections will impact both the "High" node and the "Low" node structures almost evenly.

Furthermore, the present disclosure offers ease of scalability. For example, the units 650-651 may collectively comprise a structure that can be scaled. In other words, the unit 652 may be a copy of the unit 650, and another unit disposed "below" the unit 652 (in the Y-direction) may be a copy of the unit 651. This pattern may repeat a plurality of times. In addition, each unit is not limited to having 3 metal lines connecting to 3 nodes (e.g., High-Low-High or Low-High-Low). Instead, each unit may include just two metal lines connecting to 2 nodes (e.g., High-Low or Low-High), or more than 3 metal lines connecting to more than 3 nodes. Furthermore, present disclosure can also be scaled in the X-direction by repeating the electrical routing configuration within each unit a plurality of times in the X-direction.

FIG. 11 is a flowchart of a method 900 for fabricating a FinFET device in accordance with various aspects of the present disclosure. The method 900 includes a step 910 of forming, over a dielectric structure, a plurality of gate structures that each extend in a first direction.

The method 900 includes a step 920 of forming, over the dielectric structure, a plurality of conductive contacts that each extend in the first direction. The gate structures and the conductive contacts are spaced apart from one another in a second direction different from the first direction.

The method 900 includes a step 930 of etching a trench in a portion of each of the gate structures.

The method 900 includes a step 940 of filling the trench with one or more dielectric materials.

The method 900 includes a step 950 of forming one or more vias on a remaining portion of each of the gate structures and on each of the conductive contacts.

The method 900 includes a step 960 of forming a plurality of metal lines over the vias. The metal lines are electrically interconnected to the gate structures or to the conductive contacts through respective ones of the vias.

In some embodiments, the step 950 of forming of the one or more vias and the step 960 of forming of the plurality of the metal lines are performed such that: a first group of the metal lines are associated with a first electrical node; a second group of the metal lines are associated with a second electrical node different from the first electrical node; the first group of the metal lines are electrically interconnected to a first subset of the gate structures and a first subset of the conductive contacts; and the second group of the metal lines are electrically interconnected to a second subset of the gate structures and a second subset of the conductive contacts.

In some embodiments, the first group of the metal lines and the second group of the metal lines are formed to have an alternating configuration in the first direction; the first subset of the gate structures and the second subset of the gate structures are formed to have an alternating configuration in the first direction; and the first subset of the conductive contacts and the second subset of the conductive contacts are formed to have an alternating configuration in the first direction. In some embodiments a first voltage signal is applied to the first group of the metal lines, and a second voltage signal is applied to the second group of the metal lines.

In some embodiments, an interlayer dielectric (ILD) surrounds the gate structures and the conductive contacts; and the step 940 comprises filling the trench with one or more dielectric materials having different material compositions than the ILD. In some embodiments, the step 940 comprises filling the trench with a plurality of different dielectric materials.

It is understood that additional process steps may be performed before, during, or after the steps 910-960 discussed above to complete the fabrication of the semiconductor device, but these steps are not discussed herein in detail for reasons of simplicity.

In summary, the present disclosure leverages various components in FinFET fabrication to implement capacitors on an IC. For example, a high density capacitor array may be defined using gate structures, conductive contacts, the CMG and CSC structures that "cut through" the gate structures and conductive contacts, respectively, as well as portions of an ILD. The gate structures and conductive contacts are each disposed in an alternating or interleaving configuration, which allows capacitors to be defined in both an X-direction and a Y-direction.

By implementing the capacitors in the manner described above, it can be seen that the present disclosure offers advantages over conventional capacitors on an IC. It is understood, however, that other embodiments may offer additional advantages, and not all advantages are necessarily disclosed herein, and that no particular advantage is required for all embodiments. One advantage is that by defining capacitors in both the X-direction and the Y-direction, the present disclosure enhances the capacitor density per unit chip area. That is, more capacitors may be formed in any given size chip compared to conventional devices. Another advantage is better uniformity control. For example, since not all the gate structures are electrically tied to a given type of node (e.g., a "High" node, or a "Low" node), and the same is true for the conductive contacts, the present disclosure achieves an averaging effect. Process variations or other imperfections associated with fabricating the gate structures and the conductive contacts may be "averaged out" between the "High" node and the "Low" node. Consequently, capacitors from different regions of the IC or from different ICs (which may or may not come from the same wafer) may have better uniformity. Other advantages include compatibility with existing FinFET fabrication process flows, and thus the present disclosure is easy and cheap to implement.

One aspect of the present disclosure involves a device. The device includes: a first gate structure and a second gate structure each extending in a first direction; a first conductive contact and a second conductive contact each extending in the first direction, wherein the first conductive contact and the second conductive contact are spaced apart from the first gate structure and the second gate structure in a second direction different from the first direction; a first isolation structure extending in the second direction, wherein the first isolation structure separates the first gate structure from the second gate structure; and a second isolation structure extending in the second direction, wherein the second isolation structure separates the first conductive contact from the second conductive contact; wherein: the first gate structure is electrically coupled to a first electrical node; the second gate structure is electrically coupled to a second electrical node different from the first electrical node; the first conductive contact is electrically coupled to the second electrical node; and the second conductive contact is electrically coupled to the first electrical node.

One aspect of the present disclosure involves a device. The device includes: a dielectric structure; a plurality of gate structures disposed over the dielectric structure, wherein the gate structures each extend in a first direction; a plurality of conductive contacts disposed over the dielectric structure, wherein the conductive contacts each extend in the first direction; an interlayer dielectric (ILD) disposed over the dielectric structure and between the conductive contacts and gate structures in a second direction different from the first direction; a plurality of first isolation structures disposed between adjacent gate structures, thereby separating the adjacent gate structures in the first direction; a plurality of second isolation structures disposed between adjacent conductive contacts, thereby separating the adjacent conductive contacts in the first direction; a plurality of first metal lines that are electrically interconnected to a first subset of the gate structures and a first subset of the conductive contacts; and a plurality of second metal lines that are electrically interconnected to a second subset of the gate structures and a second subset of the conductive contacts; wherein: the first metal lines interleave with the second metal lines in the first direction; the first subset of the gate structures interleave with the second subset of the gate structures in the first direction; and the first subset of the conductive contacts interleave with the second subset of the conductive contacts in the first direction.

Yet another aspect of the present disclosure involves a method. The method includes: forming, over a dielectric structure, a plurality of gate structures that each extend in a first direction; forming, over the dielectric structure, a plurality of conductive contacts that each extend in the first direction, wherein the gate structures and the conductive contacts are spaced apart from one another in a second direction different from the first direction; etching a trench in a portion of each of the gate structures; filling the trench with one or more dielectric materials; forming one or more vias on a remaining portion of each of the gate structures and on each of the conductive contacts; forming a plurality of metal lines over the vias, the metal lines being electrically interconnected to the gate structures or to the conductive contacts through respective ones of the vias; wherein the forming of the one or more vias and the forming of the plurality of the metal lines are performed such that: a first group of the metal lines are associated with a first electrical node; a second group of the metal lines are associated with a second electrical node different from the first electrical node; the first group of the metal lines are electrically interconnected to a first subset of the gate structures and a first subset of the conductive contacts; and the second group of the metal lines are electrically interconnected to a second subset of the gate structures and a second subset of the conductive contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
 a first layer; and
 a first capacitor disposed over the first layer, wherein the first capacitor includes:
  a first gate that extends in a first horizontal direction;
  a second gate that extends in the first horizontal direction; and
  a first dielectric structure that is disposed between the first gate and the second gate in the first horizontal direction, wherein the first dielectric structure includes a dielectric material and an air gap embedded in the dielectric material.

2. The device of claim 1, wherein:

the first gate is electrically coupled to a first electrical node; and the second gate is electrically coupled to a second electrical node different from the first electrical node.

3. The device of claim 2, wherein the first electrical node is an electrical low node, and the second electrical node is an electrical high node.

4. The device of claim 1, wherein the first layer includes a dielectric layer.

5. The device of claim 1, wherein the dielectric material includes multiple types of dielectric materials.

6. The device of claim 1, further including a second capacitor disposed over the first layer, wherein the second capacitor includes: the first gate, a first conductive contact that is spaced apart from the first gate in a second horizontal direction different from the first horizontal direction, and a second dielectric structure disposed at least in part between the first gate and the first conductive contact.

7. The device of claim 6, further including a third capacitor disposed over the first layer, wherein the third capacitor includes: the second gate, a second conductive contact that is spaced apart from the second gate in the second horizontal direction, and a third dielectric structure disposed at least in part between the second gate and the second conductive contact.

8. The device of claim 7, wherein the first conductive contact and the second conductive contact are spaced apart from one another in the first horizontal direction.

9. The device of claim 7, further including a fourth capacitor disposed over the first layer, wherein the fourth capacitor includes: the first conductive contact, the second conductive contact, and a fourth dielectric structure disposed at least in part between the first conductive contact and the second conductive contact.

10. The device of claim 9, wherein the second dielectric structure, the third dielectric structure, and the fourth dielectric structure are portions of an interlayer dielectric (ILD).

11. A device, comprising:

a dielectric layer;

a first capacitor disposed over the dielectric layer, wherein the first capacitor includes:

a first metal-containing gate that extends in a first horizontal direction;

a second metal-containing gate that extends in the first horizontal direction; and a first dielectric structure that separates the first metal-containing gate from the second metal-containing gate;

a second capacitor disposed over the dielectric layer, wherein the second capacitor includes:

the first metal-containing gate;

a first conductive contact is spaced apart from the first metal-containing gate in a second horizontal direction perpendicular to the first horizontal direction; and a second dielectric structure that is disposed at least partially between the first metal-containing gate and the first conductive contact; and a third capacitor disposed over the first capacitor, wherein the third capacitor includes:

the first conductive contact;

a second conductive contact that is spaced apart from the first conductive contact in the first horizontal direction; and a third dielectric structure that is disposed at least partially between the first conductive contact and the second conductive contact.

12. The device of claim 11, wherein:

the first metal-containing gate is connected to a first electrical node; and the second metal-containing gate and the first conductive contact are tied to a second electrical node different from the first electrical node.

13. The device of claim 11, wherein:

the first dielectric structure and the second dielectric structure have different material compositions; and the second dielectric structure and the third dielectric structure are portions of an interlayer dielectric (ILD).

14. The device of claim 11, wherein the first dielectric structure includes a dielectric material having a void trapped therein.

15. The device of claim 11, wherein the dielectric layer includes a shallow trench isolation (STI).

16. The device of claim 11, wherein the first metal-containing gate or the second metal-containing gate has a greater dimension in the first horizontal direction than in the second horizontal direction.

17. A device, comprising:

a first gate and a second gate that each extends in a first direction in a cross-sectional side view, wherein the first gate and the second gate are physically separated from one another but have substantially co-planar bottom surfaces in the cross-sectional side view;

a first conductive contact and a second conductive contact that each extends in the first direction;

a dielectric structure disposed between the first gate and the second gate; and an interlayer dielectric (ILD) that surrounds the first conductive contact and the second conductive contact;

wherein:

the first conductive contact is separated from the first gate in a second direction different from the first direction;

the second conductive contact is separated from the second gate in the second direction;

the first gate and the second conductive contact are electrically coupled to a first electrical node;

the second gate and the first conductive contact are electrically coupled to a second electrical node different from the first electrical node;

the first gate, the second gate, and the dielectric structure form a first capacitor;

the first gate, the first conductive contact, and a first portion of the ILD form a second capacitor;

the second gate, the second conductive contact, and a second portion of the ILD form a third capacitor; and the first conductive contact, the second conductive contact, and a third portion of the ILD form a fourth capacitor.

18. The device of claim 17, wherein:

the first gate and the second gate are physically separated from one another in the first direction by a dielectric structure;

a first side surface of the dielectric structure extends to a side surface of the first gate; and a second side surface of the dielectric structure extends to a side surface of the second gate.

19. The device of claim 17, wherein an air gap is located within the first portion of the ILD, the second portion of the ILD, or the third portion of the ILD.

20. The device of claim 17, wherein:

a dimension of the first gate in the first direction exceeds a dimension of the first gate in the second direction; or a dimension of the second gate in the first direction exceeds a dimension of the second gate in the second direction.

\* \* \* \* \*